(12) United States Patent
Dings et al.

(10) Patent No.: US 7,591,906 B2
(45) Date of Patent: Sep. 22, 2009

(54) METHOD AND APPARATUS FOR MANUFACTURING A DISPLAY, SUCH AS, FOR INSTANCE, A POLYMER OLED DISPLAY, A DISPLAY AND A SUBSTRATE FOR USE IN THE METHOD

(75) Inventors: Franciscus C. Dings, Veldhoven (NL); Marinus F. J. Evers, Heeze (NL); Peter Briër, Eindhoven (NL)

(73) Assignee: PixDro Ltd., Rosh-Ha'ain (IL)

( * ) Notice: Subject to any disclaimer, the term of this patent is extended or adjusted under 35 U.S.C. 154(b) by 224 days.

(21) Appl. No.: 10/407,945

(22) Filed: Apr. 7, 2003

(65) Prior Publication Data
US 2003/0218645 A1 Nov. 27, 2003

(30) Foreign Application Priority Data
Apr. 5, 2002 (NL) .................................... 1020312

(51) Int. Cl.
*B05C 11/10* (2006.01)
(52) U.S. Cl. ................... 118/686; 118/695; 118/696; 118/699; 118/702
(58) Field of Classification Search ................ 118/676, 118/679, 680, 681, 682, 686, 695, 696, 699, 118/702; 347/6, 7, 8, 12, 13
See application file for complete search history.

(56) References Cited

U.S. PATENT DOCUMENTS

| | | | | |
|---|---|---|---|---|
| 4,684,547 A | * | 8/1987 | DiStefano et al. ............ 427/131 |
| 5,711,989 A | * | 1/1998 | Ciardella et al. ................ 427/8 |
| 5,800,615 A | * | 9/1998 | Lambert et al. ............. 118/326 |
| 6,060,113 A | | 5/2000 | Banno et al. .................. 427/78 |
| 6,145,981 A | * | 11/2000 | Akahira et al. .............. 347/107 |
| 2001/0026307 A1 | * | 10/2001 | Akahira ....................... 347/101 |
| 2003/0059975 A1 | | 3/2003 | Sirringhaus et al. ........... 438/99 |
| 2003/0059984 A1 | | 3/2003 | Sirringhaus et al. ......... 438/141 |
| 2003/0059987 A1 | | 3/2003 | Sirringhaus et al. ......... 438/149 |
| 2003/0060038 A1 | | 3/2003 | Sirringhaus et al. ......... 438/637 |

FOREIGN PATENT DOCUMENTS

| | | |
|---|---|---|
| EP | 0 702 251 | 3/1996 |
| EP | 0 791 841 | 8/1997 |
| EP | 0930641 A2 | 7/1999 |
| EP | 1093156 A2 | 4/2001 |
| JP | 2001076619 | 3/2001 |

(Continued)

*Primary Examiner*—George R Koch, III
(74) *Attorney, Agent, or Firm*—Pillsbury Winthrop Shaw Pittman LLP

(57) ABSTRACT

Described is a method for manufacturing a display including a substrate on which a structure, such as, for instance, a matrix structure in relief, is provided, which structure bounds a number of areas, wherein, with the aid of an inkjet printhead, substantially in each area an amount of liquid is deposited, wherein with the aid of at least one sensor a measurement is performed on the substrate to determine the position of a respective area, and on the basis of the thus determined position the printhead is controlled to deliver an amount of liquid at the correct place. Also described is an apparatus for carrying out the method, a substrate for use in the method and a display obtained with the method.

16 Claims, 2 Drawing Sheets

Figure 1:
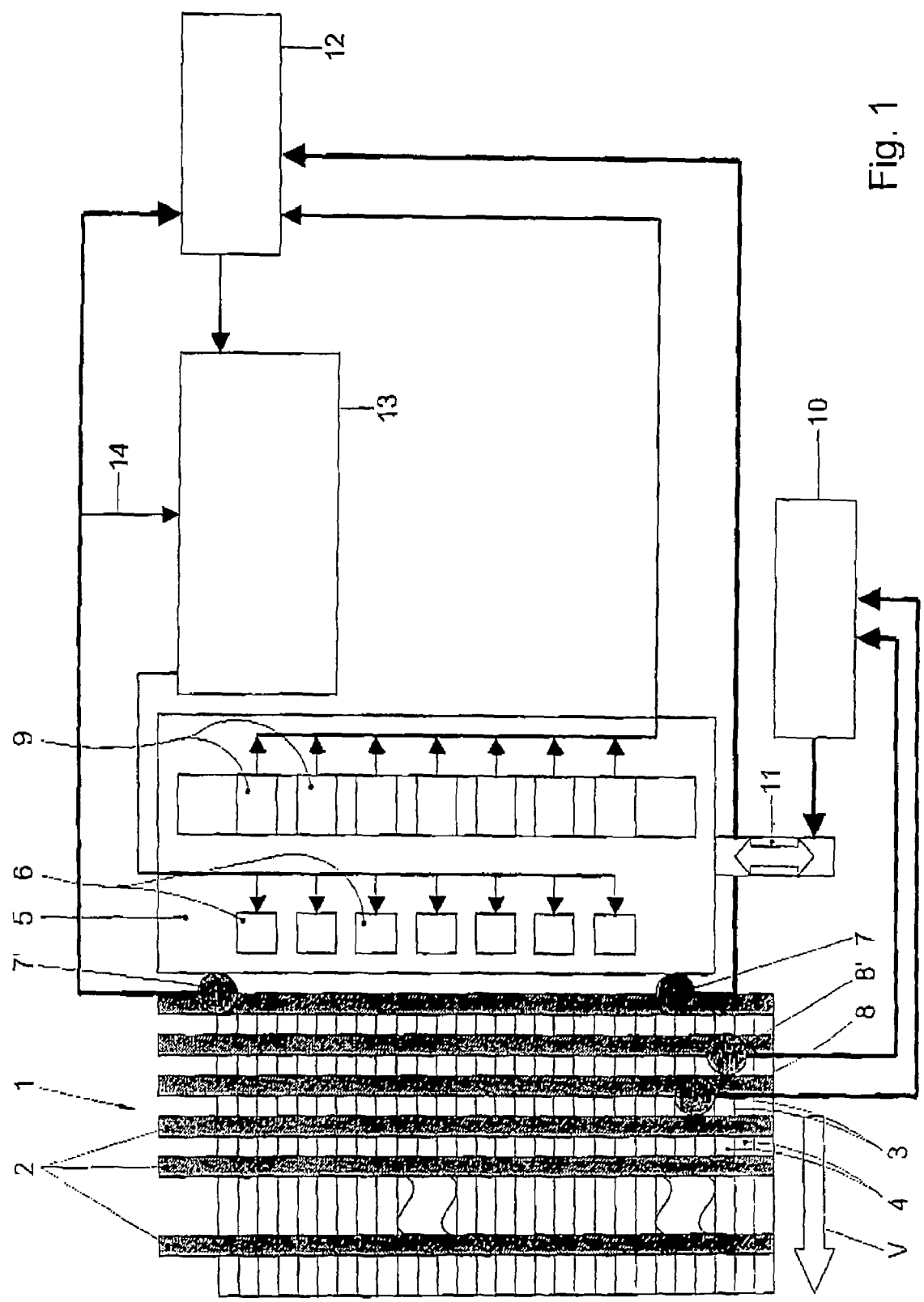

| | FOREIGN PATENT DOCUMENTS | | WO | WO 01/46987 A2 | 6/2001 |
|----|----|----|----|----|----|
| JP | 2001284047 | 10/2001 | WO | WO 01/47045 A1 | 6/2001 |
| WO | WO 99/21233 | 4/1999 | | | |
| WO | WO 00/45964 | 8/2000 | * cited by examiner | | |

METHOD AND APPARATUS FOR MANUFACTURING A DISPLAY, SUCH AS, FOR INSTANCE, A POLYMER OLED DISPLAY, A DISPLAY AND A SUBSTRATE FOR USE IN THE METHOD

CROSS REFERENCE TO RELATED APPLICATIONS

This application claims the benefit of the filing date of Dutch application NL 1020312, filed Apr. 5, 2002, the entire contents of which is incorporated herein by reference.

This invention relates to a method for manufacturing a display, such as, for instance, a polymer organic light emitting diode, comprising a substrate on which a structure, such as, for instance, a matrix structure in relief, is provided, which structure bounds a number of areas, wherein, with the aid of an inkjet printhead, an amount of liquid is deposited substantially onto each area.

This invention also relates to an apparatus for carrying out such a method, the apparatus being provided with a table for placing a substrate thereon, with an inkjet printhead for delivering liquid at a desired time, and with a displacement assembly for displacing the printhead relative to the substrate.

The substrate known per se comprises a transparent glass plate on which line-shaped, parallel transparent conductors are provided, which have a height of about 100 nm and which are made of Indium Tin Oxide (ITO) or other transparent, conductive material. Next, at right angles to the conductors, line-shaped, parallel, insulating shadowing structures have been applied, having a height of about 1-2 µm Thus, between the shadowing structures and the conducting paths, areas are formed having a length and a width of from 5 to some 400 µm. Optionally, on top of the transparent conducting paths and under the shadowing structures, a buffer layer may be provided, having a height of 0.5-5 µm, in which processes have boon provided within the areas mentioned earlier. The recesses extend to the depth of the conductor mentioned earlier, so that pits bounded on five side are formed. To make a polymer OLED display from the substrate, each area is to be filled with a polymer conductor (PDOT) and an organic electroluminescence medium (PPV). In a monochrome display a single type of PPV is deposited in all areas. A color display involves several types of PPV that emit different colors of light (for instance red, green and blue PPV). These types of PPV are to be deposited in different areas.

In the known method and apparatus for filling the areas of a substrate from which a display is being manufactured, use is made of an inkjet printhead which is movable relative to the table on which the substrate is accurately positioned. The table is provided with an electronic ruler, so that the position of the printhead relative to the table is known. In practice, it has been found that under the influence of various disturbing influences, such as, for instance, temperature variations in the substrate, an incorrect alignment of the substrate on the table and mechanical inaccuracies in the transport system of the table and/or the printhead, the liquid to be delivered by the printhead is not deposited in the areas on the substrate with sufficient accuracy (accuracies between $\frac{1}{10}$ and $\frac{1}{1000}$ of the length or width of the grain are desired). If any one of the areas of the substrate is not properly filled with liquid, such as, or instance, Pdot or red, green or blue PPV, the display will have to be rejected. It is therefore of essential importance that each area of the substrate can be accurately filled with the liquid. Especially when the substrates are greater, there is a substantial chance of defects owing to the disturbing influences mentioned earlier, such as temperature variations in the substrate, an incorrect alignment of the substrate on the table and mechanical inaccuracies in the transport system. To date, it has been attempted to tackle these problems by using a very accurate transport mechanism and very stable tables. However, practice has taught that these measures offer insufficient solace.

The object of the invention is to provide a method and an apparatus by means of which the liquid to be deposited in the areas is deposited accurately in each area without such accurate delivery of the liquid being compromised by disturbing influences such as temperature variations, an incorrect alignment of the substrate on the table and mechanical inaccuracies in the transport system or the printhead.

To that end, according to the invention, the method of the type described in the opening paragraph hereof its characterized in that with the aid of at least one sensor a measurement is performed on the substrate to determine the position of a respective area, and on the basis of the thus determined position the printhead is controlled to deliver an amount of liquid at the correct place. The apparatus of the type described above is characterized, according to the invention, in that it is provided with at least one sensor and a control for processing the signals produced by the at least one sensor, for controlling the displacement of the displacement assembly, and for timing the delivery of liquid by the printhead on the basis of the signals produced by the at least one sensor. In the most common cases, this sensor will be a sensor which gives a signal on edges of the areas (the edge of the conductor or the edge the shadowing structure). These transitions are observed by this sensor with an accuracy sufficiently high for the application. In other cases, the sensor can be of a type which can also determine its position within the area.

As the method and apparatus according to the invention involve measurement on the substrate itself, in accordance with a further elaboration preferably on the relief structure defining the position of the areas, it is known to the control with high accuracy where the area are situated and consequently at what time the printhead is to be actuated to deliver an amount of liquid. Even when due to temperature variations in the substrate the structure has obtained a different shape than would be expected under normal circumstances, such different shape is observed by the at least one sensor and the delivery of the liquid is timed by the control of the printhead, such that the liquid is still deposited at the correct position in the area. This compensation also works when the substrate is positioned on the table in imperfect alignment or when play arises in the transport system.

It is noted that the structure can also be a reference structure provided on the substrate especially for that purpose. In that case, it is important that this reference structure is not only provided very locally but also extends substantially throughout the length and width of the functional structure, for instance along the edges of the functional structure or within the functional structure, so that the reference structure can be related accurately, and also substantially in situ, to the functional structure. To that end, the functional structure can optionally be optimized for observation with the aid of sensors, for instance by including an encoder marking within the structure.

Accordingly, the invention also relates to a substrate having such a functional structure optimized for sensor observation.

Further, it is to be noted that the invention is applicable not only with the above-described known substrate of a passive polymer OLED display but also with more complex substrates, such as, for instance, an active matrix polymer OLED display, where more conductors are situated in close mutual proximity and thin film transistors with complete electronic circuits are situated in the areas referred to. These more complex structures can also be used for observation of the position by means of sensors and, based on this observation, timing and positioning the delivery of the liquid.

According to a further elaboration of the apparatus, the at least one sensor is positioned fixedly with respect to the printhead, so that in the case of a movably arranged printhead, the at least one sensor follows each movement of the printhead.

Further, according to a further elaboration of the invention, it is favorable when the displacement assembly is arranged for displacing the printhead relative to the substrate in a principal direction of movement, while two first sensors are provided which are designed for determining the skew of the structure relative to the principal direction of movement, and the control is arranged for timing the delivery of the liquid by the printhead, such that the determined skew is compensated. Preferably, the two first sensors of the pair are then mutually spaced apart such a distance that one sensor observes the shadowing structures on a first side of the printhead while the other sensor of the pair of sensors observes the shadowing structures on a second, opposite side of the printhead. Specifically when the printhead is provided with a number of nozzles arranged next to each other, it is of particular importance to determine the skew of the structure with the two sensors and, depending thereon, to control the time when the nozzles deliver the liquid, because in this way skew of the substrate relative to the row of nozzles can be compensated.

Essentially, the skew is determined by the time difference between the trigger signals of the two sensors. These trigger signals are produced at the time when a sensor passes a flank of a shadowing structure.

According to another further elaboration of the invention, at least one second sensor is provided for observing the position of the structure in a transverse direction extending perpendicularly to the principal direction of movement, while the displacement assembly is designed in such a manner that the printhead is displaceable in the transverse direction relative to the substrate by displacement of either the printhead or the table, and the control is designed for controlling the displacement in transverse direction on the basis of the position of the structure as observed by the at least one second sensor. This second sensor can observe, for instance, the position of a conducting path (ITO conductor) on the substrate. Optionally, two second sensors can be provided, of which one is directed at a conducting path and the other is directed between two conducting paths, the signal difference between the two sensors being used to control an actuator which displaces either the table or the printhead in transverse direction to keep the difference signal constant.

Naturally, within this elaboration, it is also possible to rotate the principal direction of movement 90 degrees, with the first sensor detecting the transitions of the conducting paths and the second sensor measuring the position in transverse direction of the printhead relative to the shadowing structures.

According to a still further elaboration of the invention, for each nozzle or the printhead, a third sensor corresponding to that respective nozzle is provided for the purpose of determining properties of the liquid delivered by the nozzle. These properties can be, for instance, the color, the volume, the layer thickness and/or the position of the liquid delivered. It is then preferred for the control to be designed to control the delivery of the liquid of a respective nozzle on the basis of the signals produced by the third sensor corresponding to the respective nozzle. These signals may then influence both the amount of liquid and the time of delivery of the liquid.

According to a further elaboration of the invention, at least one of the sensors may be designed as an optical pickup unit as used in a CD-ROM drive or DVD drive. Besides optical measuring principles, other principles are eligible for the sensors, such as, for instance, capacitive and magnetic principles. Different properties of the areas can be measured to determine their position, such as structure height, difference in reflection, absorption, capacitance, induction or magnetic field (eddy currents).

The invention also relates to a display obtained with the method according to the invention utilizing the apparatus according to the invention and to a substrate provided with a structure defining the areas mentioned and which is provided with a reference structure extending adjacent or between the area-defining structure.

The invention will presently be further clarified on the basis of an exemplary embodiment represented in the drawing.

Figure 2:
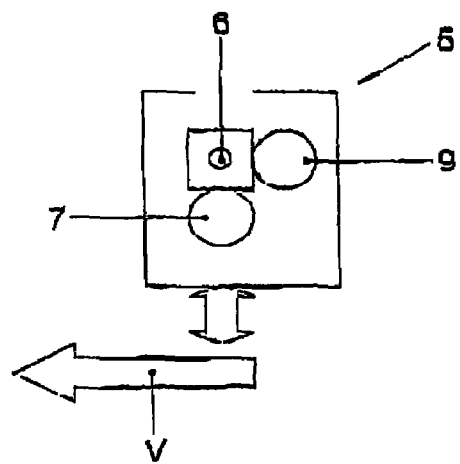
Figure 3:
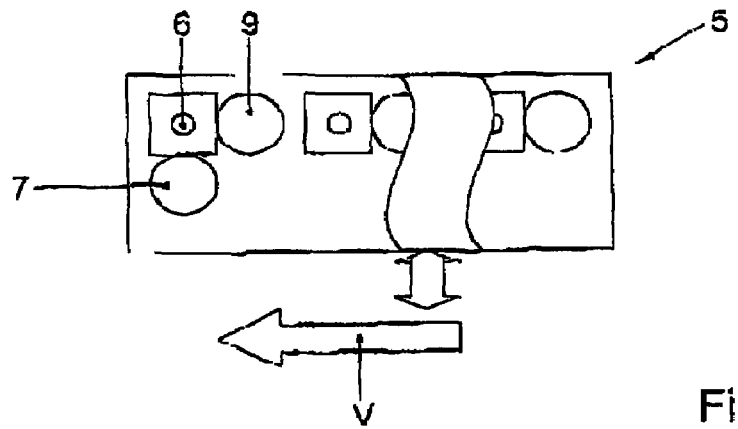
Figure 4:
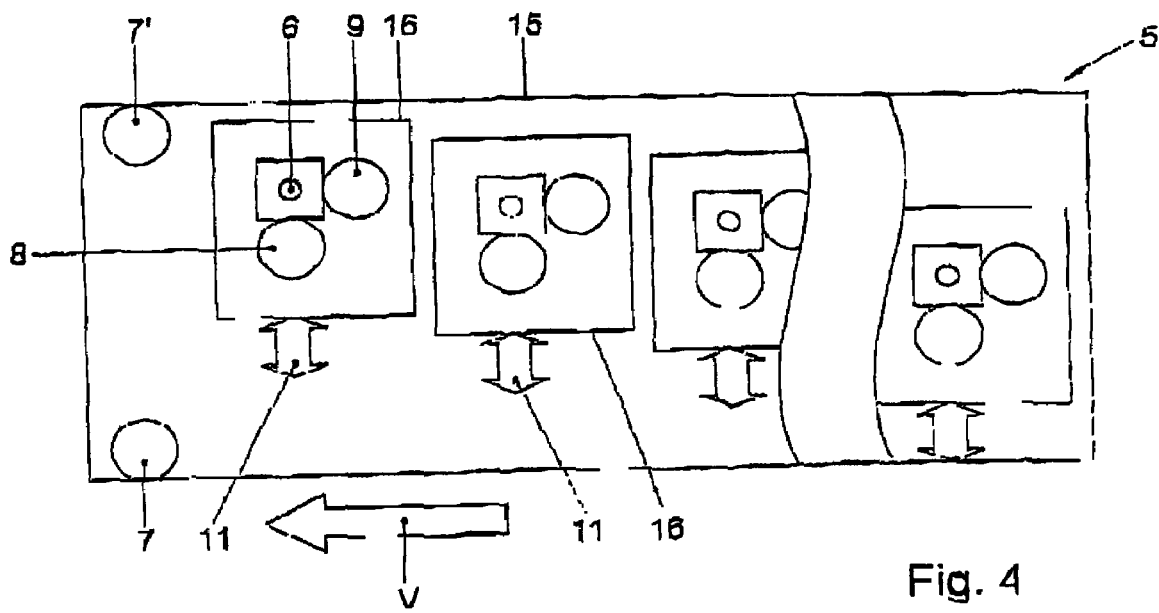

FIG. 1 shows a diagrammatic top plan view of a substrate with an inkjet printhead advancing relative thereto; and FIGS. 2-4 schematically show in top plan view number of variants of a possible printhead design.

FIG. 1 schematically shows a top plan view of a substrate 1 having provided thereon shadowing structures 2 each forming a line-shaped elevation on the substrate 1. Also provided on the substrate are conducting paths 3, which, together with the shadowing structures 2, form a matrix structure bounding areas 4 in which liquid such as Pdot and subsequently red, green or blue PPV are to be deposited. To that end, the diagrammatically represented exemplary embodiment comprises an inkjet printhead 5 which has a number of nozzles 6. Fixedly connected with this inkjet printhead 5 are a number of sensors 7, 7', 8, 8' and 9. The first sensors 7, 7' are mutually spaced apart, such that one sensor 7 is situated adjacent a first side of the printhead 5 while the other sensor 7' is situated adjacent a second, opposite side of the printhead 5. Thus, the skew in the working area of the printhead can be observed. It is also possible for the two first sensors 7, 7' to be connected with the printhead 5 such that they are situated above two opposite sides of the substrate. Thus, skewness of the entire substrate can be observed. The sensors 7, 7' can be designed, for instance, as an optical pickup unit as used in a CD or DVD drive. The sensors 7, 7' produce a signal when the sensors 7, 7' pass a flank of a shadowing structure 2. With such sensors 7, 7', the position of the flanks can be observed with an accuracy of 0.1-10 .mu.m.

Of the second sensors 8, 8', one is directed at a conducting path 3 and another is directed between two conducting paths 3. On the basis of the difference signal between the two second sensors 8, 8', a transverse alignment control 10 controls the transverse position of the inkjet printhead 5 relative to the substrate 1 through operation of an actuator 11. This actuator 11 can engage either the printhead 5 or the table on which the substrate 1 has been placed. For each nozzle 6, a third sensor 9 is provided on the printhead 5. With the aid of these third sensors 9, for instance the volume, the color and/or the position of a delivered quantity of liquid can be measured. On the basis of the signals coming from the first sensors 7, 7' and the third sensors 9, a control 12 calculates the delay times and amplitudes of the signals controlling the inkjet printhead nozzles 6. These signals are stored in a buffer 13 to be subsequently delivered to the nozzles 6 depending on a trigger signal 14 from one of the first sensors 7'. With such a closed loop control, a very accurate delivery of liquid onto the substrate 1 is accomplished. It is possible here for the printhead 5 to be moved over the substrate 1 with a constant speed V, for instance through displacement of the substrate 1 or through displacement of the printhead 5. Further, it is possible to fill the areas 4 in several passes by moving the substrate 1 relative to the printhead 5 several times. Such a multipass operation enables the use of a relatively simple printhead 5. Such a multipass operation was not properly possible in the known method because the processing operation then took so long that the substrate, under the influence of temperature changes was subject to changes in shape that led to an incorrect deposition of the liquid. That problem has presently been solved since, according to the invention, to control the delivery of the liquid, a measurement is performed on the structure of the substrate. The advantage is that a relatively simple printhead is less susceptible to failure than, for instance, a complex head having 256 nozzles. Naturally, the invention can also be of use for an apparatus provided with a combined inkjet printhead which deposits both the Pdot and the PPV or several colors of PPV in a single pass.

Examples of printheads are represented in FIGS. 2-4. FIG. 2 shows a top plan view of a printhead 5 having a single nozzle 6, a single first sensor 7 additionally having the function of second sensor, and a single third sensor 9.

FIG. 3 shows a top plan view of a printhead in which the nozzles 6, viewed in the direction of movement, are arranged in line behind each other, so that in succession different liquids can be delivered in a single pass.

FIG. 4 shows a top plan view of a combined printhead 5, where two first sensors 7, 7' are fitted on a main frame part 15 of the printhead 5, and where each nozzle 6 is arranged in the main frame part 15 go as to be movable in a subframe 16. Connected with the subframe 16 in each case are a second sensor 8 and a third sensor 9.

It will be clear that the invention is not limited to the exemplary embodiment described but that various modifications are possible within the scope of the invention as defined by the claims. Thus, the invention also encompasses the variants only provided with a single sensor or two types or sensors. Naturally, the method is also applicable with liquids not containing any polymers or like organic substances, a case in point being, for example, E-ink displays.

The invention claimed is:

1. An apparatus for performing an operation on a substrate on which a structure is provided, which structure bounds a number of areas on the substrate, wherein the apparatus comprises:
    a table for placing the substrate thereon;
    an inkjet printhead for delivering liquid at a desired time in substantially each area;
    a displacement assembly for displacing the printhead relative to the substrate;
    at least one sensor for observing the structure provided on the substrate and for producing a signal correlated with the position of each area bounded by the structure, the position of the at least one sensor being fixed relative to the printhead; and
    a control for processing the signals produced by the at least one sensor, controlling the displacement of the displacement assembly and timing the delivery of liquid by the printhead on the basis of the signals produced by the at least one sensor,
    wherein the at least one sensor observes the structure and produces the signal simultaneously while the control (i) processes the signals produced by the at least one sensor, (ii) controls the displacement of the displacement assembly, and (iii) times the delivery of liquid during relative movement of the substrate with respect to the printhead during substantially a whole process time of delivering liquid into the respective areas on the substrate bounded by the structure.

2. An apparatus according to claim 1, wherein the displacement assembly is designed for displacing the printhead relative to the substrate in a first direction, the at least one sensor comprises two first sensors for determining the skew of the structure relative to the first direction of movement, the control being arranged for timing the delivery of the liquid by the printhead, such that the determined skew is compensated.

3. A apparatus according to claim 2, wherein the at least one sensor further comprises at least one second sensor for observing the position of the structure in a second direction extending perpendicularly to the first direction, the displacement assembly being so designed that the printhead is displaceable in the second direction relative to the substrate by displacement of either the printhead or the table, the control being arranged for controlling the displacement in second direction on the basis of the position of the structure as observed by said at least one second sensor.

4. An apparatus according to claim 1, wherein the printhead comprises at least one nozzle and for each nozzle of the printhead the at least one sensor further comprises a third sensor, corresponding to that respective nozzle, for determining properties of the liquid delivered by the nozzle.

5. An apparatus according to claim 4, wherein at least one of the properties to be observed is the color, the volume, the layer thickness and the position of the liquid delivered.

6. An apparatus according to claim 4, wherein the control is arranged for controlling the delivery of the liquid of a respective nozzle on the basis of the signals produced by the third sensor corresponding to the respective nozzle.

7. An apparatus according to claim 1, wherein the at least one sensor is an optical pickup unit.

8. An apparatus according to claim 1, wherein the at least one sensor is a capacitive or eddy current sensor having a high position accuracy.

9. An apparatus for performing an operation on a substrate on which a structure is provided, which structure bounds a number of areas on the substrate, wherein the apparatus comprises:
    a table for placing the substrate thereon;
    an inkjet printhead for delivering liquid at a desired time in substantially each area;
    a displacement assembly for displacing the printhead relative to the substrate,
    at least one sensor for observing the structure provided on the substrate and for producing a signal correlated with the position of each area bounded by the structure; and
    a control for processing the signals produced by the at least one sensor, controlling the displacement of the displacement assembly and timing the delivery of liquid by the printhead on the basis of the signals produced by the at least one sensor,
    wherein, on the basis of the signals produced by the at least one sensor, the control simultaneously (i) processes the signals, (ii) controls the displacement of the displacement assembly, and (iii) times the delivery of liquid during relative movement of the substrate with respect to the printhead substantially while delivering liquid into the respective areas on the substrate bounded by the structure.

10. An apparatus according to claim 9, wherein the displacement assembly is designed for displacing the printhead relative to the substrate in a first direction, the at least one sensor comprises two first sensors for determining the skew of the structure relative to the first direction of movement, the control being arranged for timing the delivery of the liquid by the printhead, such that the determined skew is compensated.

11. A apparatus according to claim 10, wherein the at least one sensor further comprises at least one second sensor for observing the position of the structure in a second direction extending perpendicularly to the first direction, the displacement assembly being so designed that the printhead is displaceable in the second direction relative to the substrate by displacement of either the printhead or the table, the control being arranged for controlling the displacement in second direction on the basis of the position of the structure as observed by said at least one second sensor.

12. An apparatus according to claim 9, wherein the printhead comprises at least one nozzle and for each nozzle of the printhead the at least one sensor further comprises a third sensor, corresponding to that respective nozzle, for determining properties of the liquid delivered by the nozzle.

13. An apparatus according to claim 12, wherein at least one of the properties to be observed is the color, the volume, the layer thickness and the position of the liquid delivered.

14. An apparatus according to claim 12, wherein the control is arranged for controlling the delivery of the liquid of a respective nozzle on the basis of the signals produced by the third sensor corresponding to the respective nozzle.

15. An apparatus according to claim 9, wherein the at least one sensor is an optical pickup unit.

16. An apparatus according to claim 9, wherein the at least one sensor is a capacitive or eddy current sensor having a high position accuracy.

* * * * *